United States Patent
Yamada

[11] Patent Number: 6,008,068
[45] Date of Patent: *Dec. 28, 1999

[54] PROCESS FOR ETCHING A SEMICONDUCTOR LEAD FRAME

[75] Inventor: Junichi Yamada, Tokyo-To, Japan

[73] Assignee: Dai Nippon Printing Co., Ltd., Japan

[ * ] Notice: This patent is subject to a terminal disclaimer.

[21] Appl. No.: 08/877,549

[22] Filed: Jun. 17, 1997

Related U.S. Application Data

[63] Continuation of application No. 08/489,319, Jun. 12, 1995, Pat. No. 5,683,943.

[30] Foreign Application Priority Data

Jun. 14, 1994 [JP] Japan ..................................... 6-154323
Mar. 14, 1995 [JP] Japan ..................................... 7-80906

[51] Int. Cl.$^6$ .................................................. H01L 21/48
[52] U.S. Cl. ......................... 438/111; 438/123; 438/699; 438/750; 156/651
[58] Field of Search ................................... 438/111, 123, 438/699, 750; 29/827; 156/651

[56] References Cited

U.S. PATENT DOCUMENTS 4,711,700 12/1987 Cusack ..................................... 156/651
4,733,292 3/1988 Jarvis ....................................... 156/630
5,454,905 10/1995 Fogelson ............................... 156/651.1
5,683,943 11/1997 Yamada .

*Primary Examiner*—David Graybill
*Attorney, Agent, or Firm*—Parkhurst & Wendel, L.L.P.

[57] ABSTRACT

A method for producing a lead frame having outer leads and inner leads, for use in constructing a resin-sealed semiconductor package comprises etching processes for etching a blank. A first resist pattern having a first opening and a second resist pattern having second openings are formed on the first and the second major surfaces of a blank. The first and the second major surfaces of the blank are etched through the first and the second resist pattern by a first etching process using a first etchant to form a first recess corresponding to the first opening and second recesses corresponding to the second recesses in the first and the second major surfaces, respectively. The first recess is filled up with an etch-resistant layer. The second major surface is etched through the second resist pattern by a second etching process using a second etchant so that portions of the blank corresponding to the second openings of the second resist pattern are etched through to form the tips of the inner leads.

4 Claims, 8 Drawing Sheets

PROCESS FOR ETCHING A SEMICONDUCTOR LEAD FRAME

This is a Continuation of application Ser. No. 08/489,319 filed Jun. 12, 1995, U.S. Pat. No. 5,683,943.

BACKGROUND OF THE INVENTION

The present invention relates to a lead frame and a method for producing a lead frame. More particularly, the present invention relates to a lead frame capable of being produced by an etching process and a method for producing such a lead frame.

Referring to FIG. 8 showing the configuration of a generally known resin-sealed semiconductor package 60, such as a plastic lead frame package, when fabricating the resin-sealed semiconductor package 60, a semiconductor device 69 is mounted on a lead frame 61 of 42 Alloy (a Ni/Fe alloy comprising 42% Ni)alloy), and then the semiconductor device 69 is sealed with a resin 65. The number of the inner leads 63 of the lead frame 61 is equal to that of the bonding pads 66 of the semiconductor device 69. The lead frame 61 has a die pad 62 to be mounted with the semiconductor device 69, and outer leads 64 to be electrically connected to the associated circuits. The tips of the inner leads 63 are connected electrically to the bonding pads 66 of the semiconductor device 69 with bonding wires 67, respectively. After mounting the semiconductor device 69 on the die pad 62 and connecting the bonding pads 66 to the inner leads 63, respectively, the semiconductor device 69 is sealed with the resin 65 to protect the semiconductor device 69 from external stresses and contaminants.

Recently, there has been growing demand for the miniaturization and reduction in thickness of resin-sealed semiconductor packages employing lead frames like the lead frame 61 (plastic lead frame packages) and the increase of the number of terminals of resin-sealed semiconductor packages as electronic apparatuses are miniaturized progressively and the degree of integration of semiconductor devices increases progressively. Consequently, recent resin-sealed semiconductor packages, particularly, quad flat packages (QFPs) and thin quad flat packages (TQFPS) have each a greatly increased number of pins.

Lead frames having fine inner leads arranged at small pitches among lead frames for semiconductor packages are fabricated by a photolithographic etching process, while lead frames having inner leads arranged at comparatively large pitches among lead frames for semiconductor packages are fabricated by press working. However, lead frames having a large number of fine inner leads to be used for forming semiconductor packages having a large number of pins are fabricated by subjecting a blank of a thickness on the order of 0.25 mm to an etching process regardless of size.

The etching process for forming a lead frame having fine inner leads will be described hereinafter with reference to FIG. 7. First a copper alloy or 42 alloy thin sheet 51 of a thickness on the order of 0.25 mm (blank for a lead frame) is cleaned perfectly (FIG. 7(a)). Then, a photoresist, such as a water-soluble casein photoresist containing potassium dichromate as sensitive agent, is spread in photoresist films 52 over the opposite major surfaces of the thin sheet 51 as shown in FIG. 7(b). Then, the photoresist films 52 are exposed through a mask of a predetermined pattern to light emitted by a high-pressure mercury lamp, the thin sheet 51 is immersed in a developer for development to form a patterned photoresist films 53 as shown in FIG. 7(c). Then, the thin sheet 51 is subjected, when need be, to a hardening process, a washing process and such, and then an etchant containing ferric chloride as a principal component is sprayed against the thin sheet 51 to etch through portions of the thin sheet 51 not coated with the patterned photoresist films 53 so that inner leads 63 of predetermined sizes and predetermined shapes are formed as shown in FIG. 7(d). Then, the patterned resist films 53 are removed, the patterned thin sheet 51 is washed to complete a lead frame 61 having the inner leads 63 of desired shapes as shown in FIG. 7(e).

Predetermined areas of the lead frame 61 thus formed by the etching process are silver-plated. After being washed and dried, an adhesive polyimide tape is stuck to the inner leads 63 for fixation, predetermined tab bars are bent, when need be, and the die pad is depressed.

In the etching process, the etchant etches the thin sheet 51 in both the direction of the thickness and directions perpendicular to the direction of the thickness, which limits the miniaturization of inner lead pitches of lead frames.

Since the thin sheet 51 is etched from both the major surfaces as best shown in FIG. 7(d) during the etching process, it is said, when the lead frame has a line-and-space shape, that the smallest possible intervals between the lines are in the range of 50 to 100% of the thickness of the thin sheet 51.

From the viewpoint of forming the outer leads 64 having a sufficient strength, generally, the thickness of the thin sheet 51 must be about 0.125 mm or above.

Furthermore, the width of the inner leads 63 must be in the range of 70 to 80 μm for successful wire bonding. When the etching process as illustrated in FIG. 7 is employed in fabricating a lead frame, a thin sheet of a small thickness in the range of 0.125 to 0.15 mm is used and inner leads are formed by etching so that the fine tips thereof are arranged at a pitch of about 0.165 mm.

However, recent miniature resin-sealed semiconductor packages requires inner leads arranged at pitches in the range of 0.13 to 0.15 mm, far smaller than 0.165 mm. When a lead frame is fabricated by processing a thin sheet of a reduced thickness, the strength of the outer leads of such a lead frame is not large enough to withstand external forces that may be applied thereto in the following processes including an assembling process and a chip mounting process. Accordingly, there is a limit to the reduction of the thickness of the thin sheet to enable the fabrication of a minute lead frame having fine leads arranged at very small pitches by etching.

An etching method previously proposed to overcome such difficulties subjects a thin sheet to an etching process to form a lead frame after reducing the thickness of portions of the thin sheet corresponding to the inner leads of the lead frame by half etching or pressing to form the fine inner leads by etching without reducing the strength of the outer leads. However, problems arise in accuracy in the following processes when the lead frame is formed by etching after reducing the thickness of the portions corresponding to the inner leads by pressing; for example, the smoothness of the surfaces of plated areas is unsatisfactory, the inner leads cannot be formed in a flatness and a dimensional accuracy required to clamp the lead frame accurately for bonding and molding, and a platemaking process must be repeated twice making the lead fabricating process intricate. It is also necessary to repeat a platemaking process twice when the thickness of the portions of the thin sheet corresponding to the inner leads is reduced by half etching before subjecting the thin sheet to an etching process for forming the lead frame, which also makes the lead frame fabricating process intricate. Thus, this previously proposed etching method has not yet been applied to practical lead frame fabricating processes.

In some cases, oxides and hydroxides are formed on the surfaces of portions of a lead frame and the surfaces of the portions are tarnished due to etching when the lead frame is formed by etching a thin sheet of a copper alloy, i.e., a blank for forming the lead frame, which is inferred to be due to the action of dissolved oxygen and the like contained in a washing liquid (water) used for cleaning the lead frame after etching on the highly reactive metal surfaces exposed by etching. Such an oxide and a hydroxide are hard to dissolve and cannot be completely removed by a chemical polishing process, i.e., a preprocessing process preceding a plating process, to which the lead frame formed by etching is subjected before a plating process.

The tips of the inner leads of the lead frame to be electrically connected to the terminals of a semiconductor device by bonding wires are plated with gold or the like. If the surfaces of areas to be plated of the tips of the inner leads are coated with the oxide or the hydroxide, the oxide or the hydroxide cannot be completely removed by the chemical polishing process, consequently, the areas of the tips of the inner lead cannot be uniformly plated and faulty wire-bonding results.

Accordingly, there has been a demand for a lead frame having fine inner leads arranged at very small pitches suitable for forming a miniaturized semiconductor package having an increased number of pins, having outer leads having a sufficiently high strength, and having less portions tarnished by an oxide or a hydroxide, and for a method of fabricating such a lead frame.

SUMMARY OF THE INVENTION

The present invention has been made in view of the aforesaid problems in the prior art and it is therefore an object of the present invention to provide a lead frame having inner leads having fine tips arranged at very small pitches, and capable of functioning properly in the following processes including an assembling process and a packaging process, and a method for producing such a lead frame.

A method for producing a lead frame for a resin-sealed semiconductor package by etching, in a first aspect of the present invention comprises: a coating process for coating a first and a second major surface of a blank for a lead frame with a first and a second photoresist layer, respectively; a resist pattern forming process for forming a first resist pattern having a first opening on the first major surface of the blank by exposing the first photoresist layer through a first pattern mask and then by developing the first photoresist layer, and a second resist pattern having second openings on the second major surface of the blank by exposing the second photoresist layer through a second pattern mask and then by developing the second photoresist layer; a first etching process for etching at least the first major surface of the blank in a predetermined depth with a first etchant; an etch-resistant layer forming process for forming an etch-resistant layer of an etch-resistant material so as to fill up the etched recess in the first major surface of the blank; a second etching process for etching the second major surface of the blank corresponding to the second openings of the second resist pattern with a second etchant so as to etch through portions of the blank corresponding to the second openings of the second resist pattern to form a semifinished lead frame; and a cleaning process for removing the etch-resistant layer, the first resist pattern and the second resist pattern from the semifinished lead frame and cleaning the semifinished lead frame.

A method for producing a lead frame for a resin-sealed semiconductor package, in a second aspect of the present invention further comprises a first cleaning process for cleaning the surface of the etched recess formed in the first major surface of the blank after the first etching process, a first pickling process for pickling the blank to remove oxides and hydroxides from the etched portions of the first major surface and a first protective film forming process for forming a protective film to prevent the oxidation and hydration of the pickled blank.

A method for producing a lead frame for a resin-sealed semiconductor package, in a third aspect of the present invention further comprises a second cleaning process for cleaning both the major surfaces of the blank after the resist pattern removing process a second pickling process for pickling both the surfaces to remove oxides and hydroxides from the semifinished lead frame and a second protective film forming process for forming a protective film to prevent the oxidation and hydration of the semifinished lead frame.

A lead frame for a resin-sealed semiconductor package, formed by etching, in a fourth aspect of the present invention has outer leads and inner leads with tops; wherein the tips of the inner leads have thickness smaller than that of other portions of the lead frame, the tip of each inner lead has one surface depressed relative to one of the surfaces of each of other portions of the lead frame and the other surface flush with the other surface of each of other portions of the lead frame, and the opposite surfaces of the tip of each inner lead have areas greater than the sectional area of the middle portion with respect to the thickness of the tip of the same inner lead.

The above and other objects features and advantages of the present invention will become more apparent from the following description taken in connection with the accompanying drawings.

DETAILED DESCRIPTION OF THE INVENTION

First Embodiment

A lead frame producing method in a first embodiment according to the present invention will be explained with reference to FIG. 1 through FIG. 4B.

Figure 1:
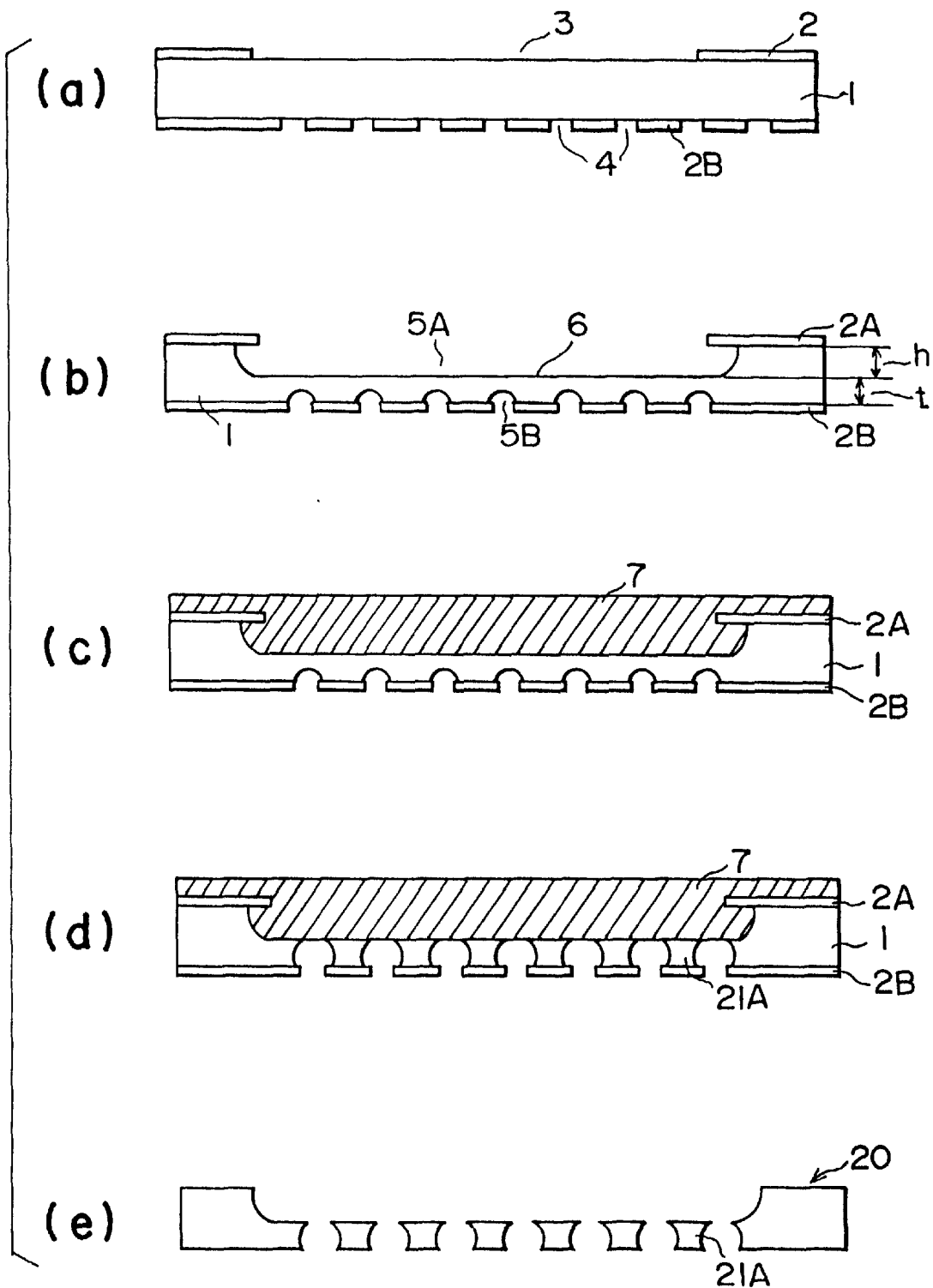
FIGS. 1A–1E are views of assistance in explaining a method for producing a lead frame, in a first embodiment according to the present invention.
Figure 2A:
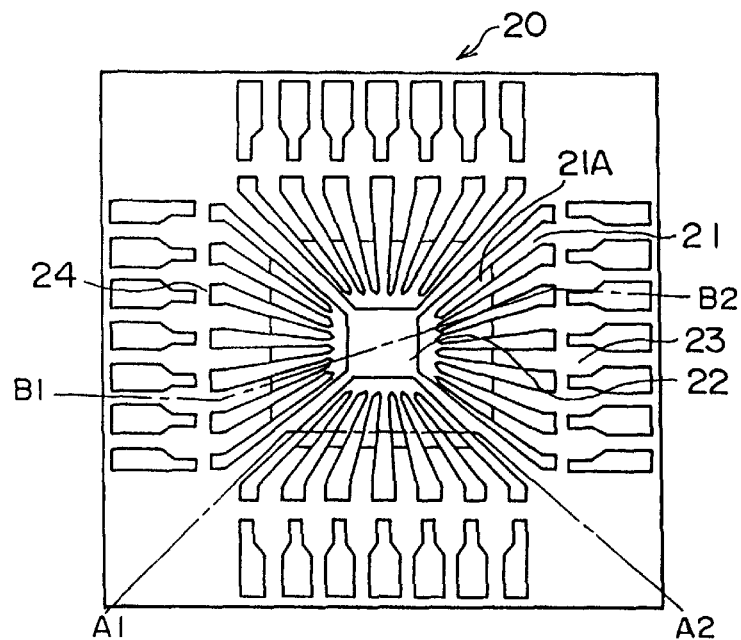
FIG. 2A is a plan view of a lead frame embodying the present invention.

FIG. 1 shows an essential portion including the tips of inner leads 21 of a lead frame, corresponding to a section $A_1$–$A_2$ in FIG. 2A in different phases of a process for fabricating the lead frame.

Referring to FIG. 1(a), a first major surface and a second major surface of a 0.15 mm thick 42% Ni/Fe alloy blank 1 for forming a lead frame are coated with photoresist films of a water-soluble casein resist containing potassium dichromate as sensitive agent, respectively. The photoresist films are exposed through a first pattern mask 11 and a second pattern mask 12 and then develop to form a first resist pattern 2A having a first opening 3 of a predetermined shape and a second resist pattern 2B having second openings 4 of predetermined shapes over the first and the second major surface of the blank 1, respectively.

Figure 2B:
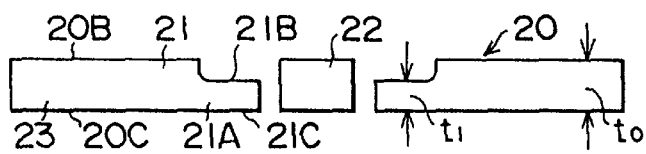
FIG. 2B is a sectional view taken on line B-B in FIG. 2A.

As shown in FIGS. 2A and 2B, the first opening 3 of the first resist pattern 2A has the shape for entirely etching a wide area in the first major surface of the blank 1 and the second openings 4 of the second resist pattern 2B have the shapes corresponding to the those of the tips 21A of the inner leads 21 of a lead frame 20.

The first opening 3 of the first resist pattern 2A includes at least areas of the blank 1 corresponding to the tips 21A of the inner leads 21. However, the area to be etched by a first etching process must be greater than the area including the tips 21A of the inner leads 21, because the step between a thin portion of the blank 1 corresponding to the first opening 3 of the first resist pattern 2A and the rest portions of the blank 1 makes work for firmly clamping the blank 1 to hold the lead frame 20 difficult in, for example, a taping process and a bonding process.

Figure 2C:
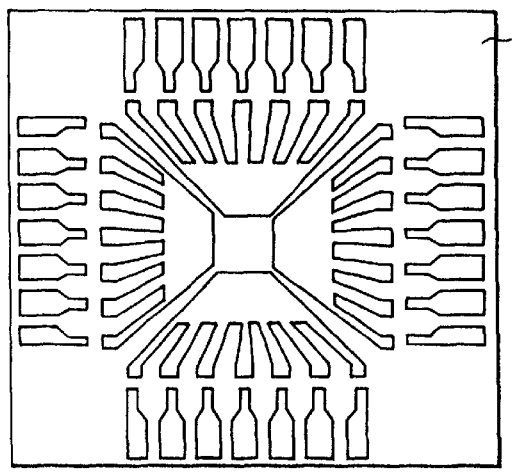
FIG. 2C is a plan view of a pattern mask to be used in fabricating the lead frame of FIG. 2A.
Figure 2D:
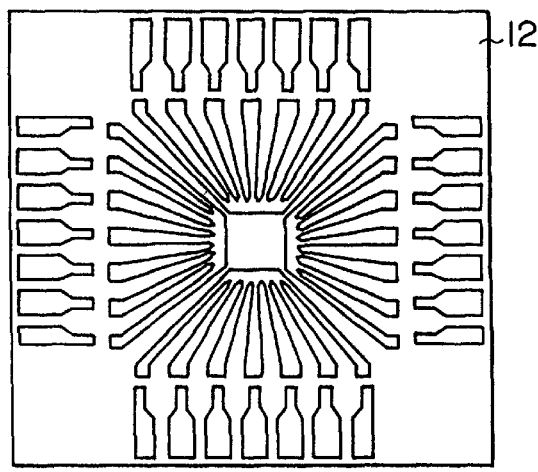
FIG. 2D is a plan view of a pattern mask to be used in fabricating the lead frame of FIG. 2A.

FIGS. 2C and 2D show the first pattern mask 11 and the second pattern mask 12 for forming the resist patterns 2A and 2B on the opposite major surfaces of the blank 1, respectively. The first opening 3 is formed by using the first pattern mask 11 of FIG. 2C and the second openings 4 are formed by using the second pattern mask 12 of FIG. 2D. Then, the first etching process is carried out to form recesses 5A and 5B in the blank 1 by etching both the major surfaces of the blank 1 covered with the first resist pattern 2A and the second resist pattern 2B, respectively, by spraying a 48 Bé ferric chloride solution of 57 C, i.e., a first etchant, at a pressure of 2.5 kg/cm against both the major surfaces of the blank 1. The first etching process is terminated after the depth h of the flat recess 5A corresponding to the first resist pattern 2A has reached a value in the range of ½ to ⅘ of the thickness of the blank 1 as shown in FIG. 1(b).

Figure 4A:
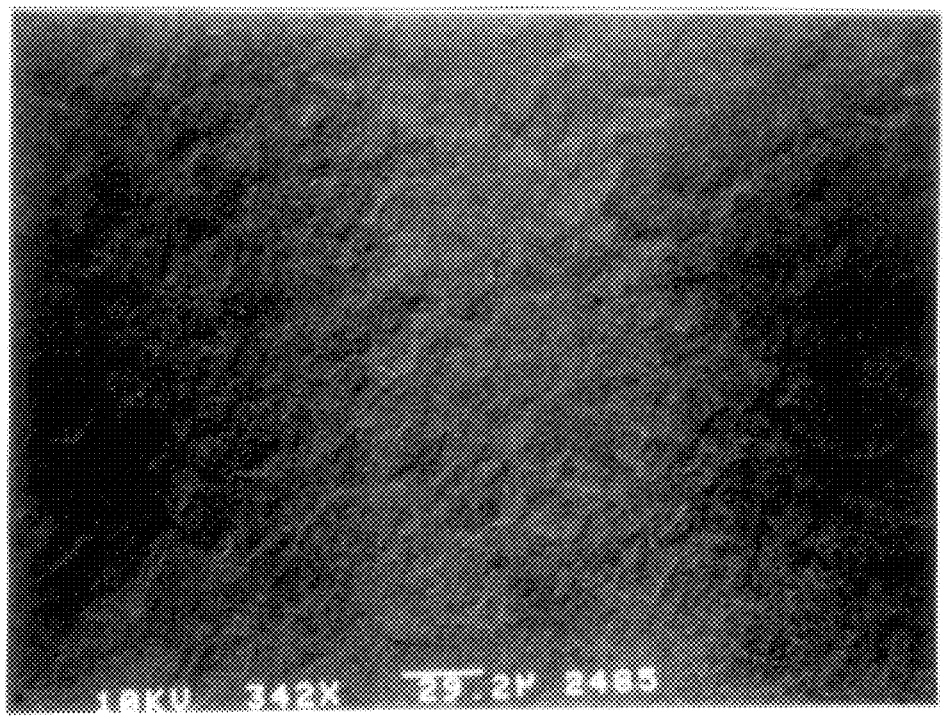
FIG. 4A is a photograph of an etched surface of a blank for forming a lead frame embodying the present invention.
Figure 4B:
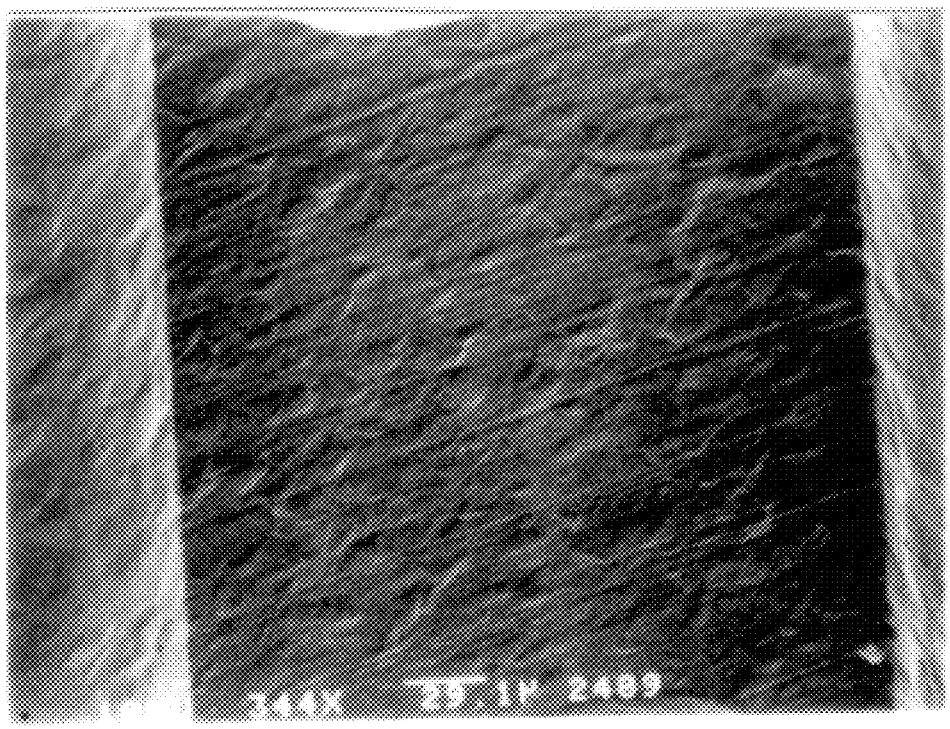
FIG. 4B is a photograph of an unetched surface of the blank.

As is obvious from the comparative observation of photographs shown in FIGS. 4A and 4B, the surface roughness of the flat bottom surface 6 of the recess 5A formed by the first etching process is smaller than that of the unetched surface of the blank 1. The flat bottom surface 6 of the recess 5A is not roughened and smooth as shown in FIG. 4A when the temperature of the first etchant is 55° C. or above, the ferric chloride concentration of the first etchant is 47 Bé or above and the spraying pressure is 2.0 kg/cm or above.

Then, the surface provided with the recess 5A formed by the first etching process is coated with an etch-resistant hot-melt wax (acidic wax type MR-WB6, The Inctec Inc.) by a die coater to form an etch-resistant layer 7 so as to fill up the recess 5A and to cover the first resist pattern 2A as shown in FIG. 1(c).

The thickness of a portion of the etch-resistant layer 7 covering the first resist pattern 2A is about 100 μm. Although the hot-melt wax employed in this embodiment is an alkali-soluble wax, any suitable wax resistant to the etching action of the etchant and remaining somewhat soft during etching may be used. A wax for forming the etch-resistant layer 7 is not limited to the aforesaid wax, but may be a wax of a UV-setting type.

Since the recess 5A is thus filled up with the etch-resistant layer 7, the flat bottom surface 6 of the recess 5A is not etched in the following second etching process. The etch-resistant layer 7 enhances the mechanical strength of the blank 1 for the second etching process to enable a second etchant to be sprayed at an increased spraying pressure, for example, 2.5 kg/cm or above, in the second etching process. The increased spraying pressure promotes the progress of etching in the direction of the thickness of the blank 1 in the second etching process, so that the perpendicularity of the side surfaces of etched recesses to the surface of the blank 1 can be improved. The etch-resistant layer 7 prevents the etching of portions other than the flat bottom surface 6 of the recess 5A.

Then, as shown in FIG. 1(d), the blank 1 is subjected to a second etching process, in which a second etchant, which is the same as the first etchant, is sprayed against the major surface provided with the recesses 5B of the blank 1 to form the tips 21A of inner leads 21 by etching through portions of the blank 1 corresponding to the recesses 5B.

Then, the blank 1 is cleaned, the etch-resistant layer 7 is removed, and then the first resist pattern 2A and the second resist pattern 2B are removed to obtain a semifinished lead frame 20 having the inner leads 21 with the fine tips 21A as shown in FIG. 1(e). A sodium hydroxide solution dissolves the etch-resistant layer 7, the first resist pattern 2A and the second resist pattern 2B away.

The fineness of the tips 21A of the inner leads 21 formed by this method is dependent on the depth h of the recess 5A; in other words, on the thickness t (FIG. 1(b)) of portions of the blank 1 corresponding to the tips 21A of the inner leads 21. For example, the pitch p between the tips 21A of the adjacent inner leads 21 can be 0.15 mm when the thickness t is 50 μm and the width $W_2$ (FIG. 3A) of the surfaces of the tips 21A of the inner leads 21 is 100 μm, and can be 0.12 mm when the thickness t is about 30 μm and the width $W_2$ is about 70 μm. The pitch p can be further reduced if the thickness t and the width $W_2$ are properly determined.

A lead frame 20 embodying the present invention will be described hereinafter. FIG. 2A is a schematic plan view of the lead frame 20, FIG. 2B is a sectional view taken on line $B_1$–$B_2$ in FIG. 2A, and FIG. 3A is an enlarged sectional view of the tip 21A of an inner lead 21 of the lead frame 20.

Referring to FIG. 2A, the lead frame 20 has inner leads 21, outer leads 23 continuous with the inner leads 21, respectively, a die pad 22 and dam bars 24. The inner leads 21 have tips 21A, respectively, and each tip 21A has a flat upper surface 21B finished by etching. The lead frame 20 was fabricated by processing a 42% Ni/Fe alloy blank by the aforesaid lead frame fabricating method. As shown in FIG. 2B, the thickness to of the lead frame 20 is 0.15 mm and the thickness $t_1$ of the tips 21A of the inner leads 21 is 50 $\mu$m. The width $W_2$ (FIG. 3A) of the lower surface 21C of the tip 21A of each inner lead 21 is 100 $\mu$m. The flat upper surfaces 21B of the tips 21A are finished by etching using a 48 Bé ferric chloride aqueous solution heated at 57° C. as etchant and are satisfactorily smooth surfaces as shown in FIG. 4A ensuring satisfactory wire bonding.

Although the thickness $t_1$ of the tips 21A of the inner leads 21 of The lead frame 20 is as small as 50 $\mu$m, the lead frame 20 has a sufficient mechanical strength to withstand external forces that may act thereon in the processes following the second etching process, because the thickness $t_0$ of portions of the lead frame 20 other than the tips 21A, for example the outer leads, is as large as 0.15 mm. As shown in FIG. 2B, the flat upper surfaces 21B of the tips 21A of the inner leads 21 are depressed relative to the upper surfaces 20B of the other portions of the lead frame 20, and the lower surfaces 21C of the tips 21A of the inner leads 21 are flush with the lower surface 20C of the other portions of the lead frame 20.

Figure 3A:
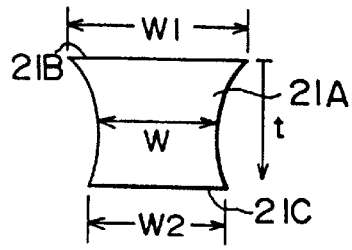
FIG. 3A is a sectional view of the tip of an inner lead of a lead frame embodying the present invention.
Figure 3B:
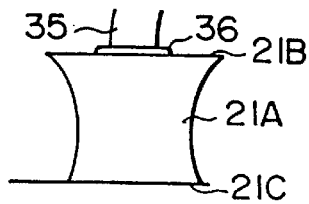
FIG. 3B is a sectional view of the tip of a inner lead of a lead frame embodying the present invention as bonded to a bonding wire.
Figure 3C:
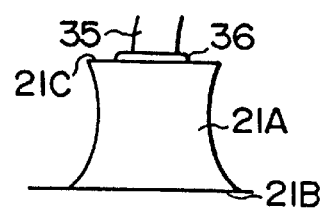
FIG. 3C is a sectional view of the tip of an inner lead of a lead frame embodying the present invention as bonded to a bonding wire.

The tip 21A of each inner lead 21 of the lead frame 20 has a sectional shape as shown in FIG. 3A. The width $W_1$ of the upper surface 21B of the tip 21A is greater than the width $W_2$ of the lower surface 21C. The widths $W_1$ and $w_2$ which are about 100 $\mu$m, are greater than the width W of the middle portion of the tip 21A with respect to the thickness. That is, the areas of the upper surface 21B and the lower surface 21C of the tip 21A of each inner lead 21 are greater than the area of the middle portion of the tip 21A with respect to the thickness. Since the upper surface 21B and the lower surface 21C of the tip 21A of each inner lead 21 are wider than the middle portion, the tip 21A of each inner lead 21 can be easily connected to a terminal of a semiconductor device, not shown, by bonding a bonding wire 35, such as a gold wire, to a plated layer 36 formed on either the upper surface 21B as shown in FIG. 3B or the lower surface 21C as shown in FIG. 3C. Since the upper surfaces 21B of the tips 21A are smooth as shown in FIG. 4A, the etched flat upper surfaces 21B are particularly suitable for wire bonding.

Figure 3D:
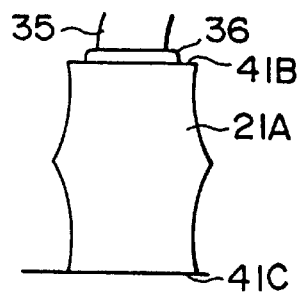
FIG. 3D is a sectional view of the tip of an inner lead of a conventional lead frame as bonded to a bonding wire.
Figure 7:
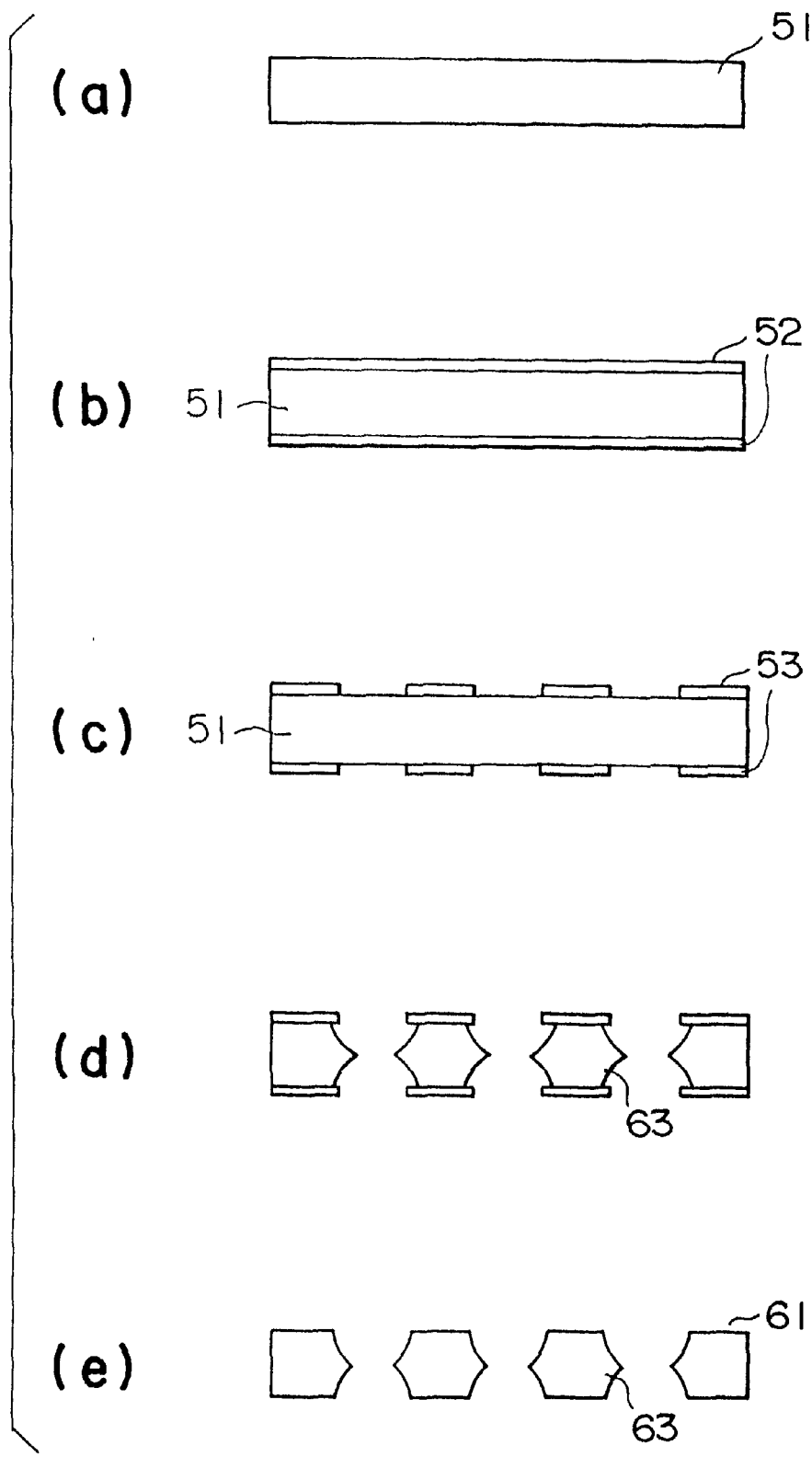
FIGS. 7 is a view of assistance in explaining a conventional method of fabricating a lead frame.
Figure 8:
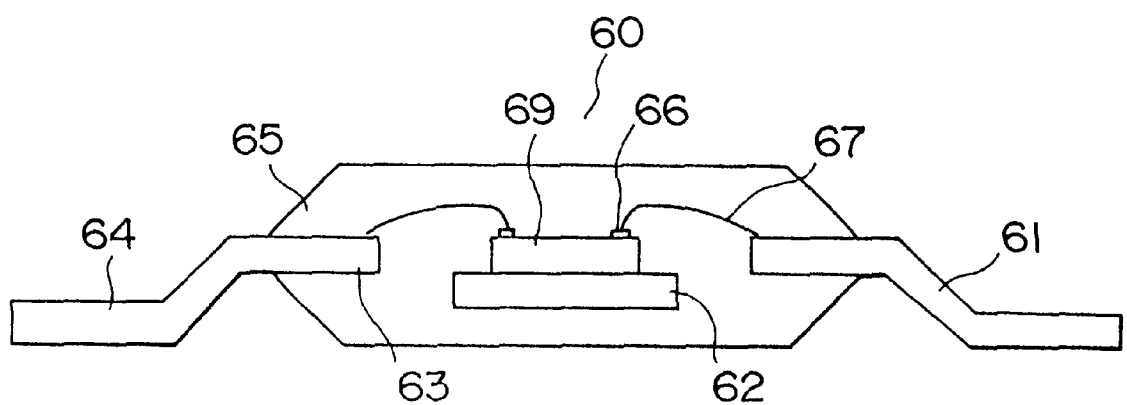
FIG. 8 is a typical sectional view of a conventional semiconductor package.

FIG. 3D shows the tip 21A of an inner lead 21 of a lead frame fabricated by the conventional lead frame fabricating method previously described with reference to FIG. 7 and a bonding wire bonded to a plated layer 36 formed on the upper surface 41B of the tip 21A and connecting the inner lead 21 to a semiconductor device, not shown. Although the surfaces 41B and 41C of the tip 21A of this inner lead 21 are flat, the surfaces 41B and 41C cannot be formed in a width greater than that of the middle portion of the tip 21A with respect to the thickness. Since both the surfaces 41B and 41C are portions of the unprocessed surfaces of the blank for forming this lead frame, the aptitude thereof for bonding is inferior to that of the etched flat upper surface 21B of the tip 21A of the inner leads 21 of the lead frame 20 of the present invention.

Figure 3E:
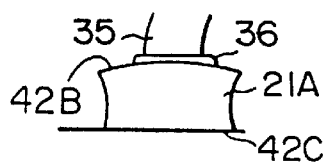
FIG. 3E is a sectional view of the tip of an inner lead of a conventional lead frame as bonded to a bonding wire.
Figure 3F:
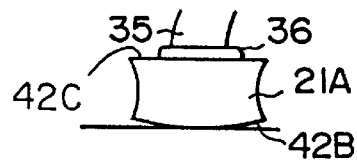
FIG. 3F is a sectional view of the tip of an inner lead of a conventional lead frame as bonded to a bonding wire.

FIGS. 3E and 3F show the tip 21A of an inner lead 21 formed by etching a blank after reducing the thickness of a portion of the blank for the tips of inner leads 21 by pressing. A bonding wire 35 is bonded to a plated layer 36 formed on one surface 42B formed by pressing of the tip 21A in FIG. 3E, and a bonding wire 35 is bonded to a plated layer 36 formed on the other surface 42C of the same tip 21A in FIG. 3F. Since the surface 42B is curved, the tip 21A is unstable when bonding the bonding wire 35 to either the surface 42B or 42C, which may cause a problem in the reliability of the semiconductor package.

Figure 3G:
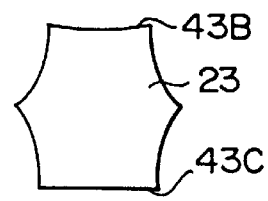
FIG. 3G is a sectional view of an inner lead of a lead frame embodying the present invention.

The outer leads 23 of the lead frame 20 of the present invention are formed by the same method as the conventional method and, therefore, the areas of the opposite surfaces 43B and 43C of each outer lead are smaller than the area of the middle portion the same as shown in FIG. 3G.

As mentioned above, the roughness of the flat bottom surface 6 of the recess 5A formed by etching shown in FIG. 4A, as compared with that of the unetched surface of the blank 1 shown in FIG. 4B, is insignificant. Consequently, satisfactory wire bonding can be achieved when the bonding wire is bonded to the etched upper surface 21B of the tip 21A.

As mentioned above, the lead frame fabricating method of the present invention forms the inner leads 21 after reducing the thickness of a portion of the blank 1 corresponding to the tips 21A of the inner leads by etching. The portion of the blank 1 corresponding to the tips 21A of the inner leads 21 can be etched in a desired thickness simply by forming the resist pattern so that the portion of the blank 1 corresponding to the tips 21A of the inner leads 21 are exposed and adjusting the etching time. It is also possible to adjust the thickness of the tips 21A of the inner leads 21 by etching the portion of the blank 1 corresponding to the tips 21A for a predetermined etching time, using an appropriate pattern mask.

Since the lead frame fabricating method of the present invention reduces the thickness of only a portion of the blank 1 corresponding to the tips 21A of the inner leads 21 of the lead frame 20, the semifinished lead frame 20 has a sufficient mechanical strength to withstand external forces that may act on the semifinished lead frame 20 in the following processes. The lead frame fabricating method of the present invention is capable of fabricating a lead frame 20 having fine inner leads 21 arranged at a very small pitch and of etching the opposite surfaces of the fine tips 21A of the inner leads 21 in flat surfaces in a high accuracy.

Furthermore, since the lead frame fabricating method of the present invention forms only the tips 21A of the inner leads 21 in a thickness smaller than that of the blank 1, while the conventional lead frame fabricating method uses a blank of a reduced thickness, the lead frame 20 fabricated by the lead frame fabricating method of the present invention, as compared with a lead frame fabricated by the conventional lead frame fabricating method, is strong. The etch-resistant layer 7 filling up the recess 5A formed by the first etching process enhances the mechanical stability of the blank 1 during the process for processing the tips 21A of the inner leads 21.

Since the recess 5A is filled up with the etch-resistant layer 7, the flat bottom surface 6 of the recess 5A formed by the first etching process is not exposed directly to the etchant even when the portion of the blank 1 corresponding to spaces between the adjacent tips 21A of the inner leads 21 are etched through. The inner leads 21 can be formed so that the width $W_1$ of the upper surfaces 21B of the tips 21A is greater than the width $W_2$ of the lower surfaces 21C of the same as shown in FIG. 3A. Therefore, both the upper surface 21B and the lower surface 21C of the tip 21A of each inner lead 21 are suitable for use in connecting the inner lead 21 to a semiconductor device by wire bonding.

The lead frame fabricating method of the present invention is capable of etching the blank 1 to form the recess 5 having the flat, smooth bottom surface 6 as shown in FIG. 4A by using the blank 1 of 42% Ni/Fe, and the first etchant of 47 Bé ferric chloride concentration or above and of a temperature of 55° C. or above, and both the surfaces 21B and 21C of the tip of each inner lead 21 are suitable for use in connecting the inner lead 21 to a semiconductor device by wire bonding.

Thus, the lead frame fabricating method of the present invention is capable of fabricating the lead frame having the inner leads 21 having such fine tips 21A and of finishing the surfaces of the tips 21A in flat, smooth surfaces.

The lead frame 20 of the present invention thus fabricated has a sufficient mechanical strength to withstand mechanical forces that may act thereon in the following processes. The both the surfaces 21B and 21C of the tip 21A of each inner lead 21 of the lead frame 20, having shapes suitable for use in connecting the inner lead 21 to a semiconductor device by wire bonding enhances the degree of freedom of the wire bonding process for connecting the inner leads 21 to a semiconductor device.

The lead frame 20 of the present invention formed by processing the blank 1 of the 42% Ni/Fe alloy and having the inner leads 21 with tips 21A each having the smooth, flat upper surface 21B depressed relative to the upper surface 20B of both lead frame 20 and formed by both first etching process using the first etchant of 47 Bé ferric chloride concentration or above and of a temperature of 55° C. or above has satisfactory aptitude for wire bonding.

The lead frame producing method of the present invention is capable of fabricating a lead frame suitable for forming a semiconductor package having an increased number of pins and requiring a lead frame having inner leads 21 having fine tips and arranged at a very small pitch and outer leads having a sufficient strength to withstand external forces that may act thereon in the following processes.

The lead frame 20 of the present invention is capable of meeting the requirements of a miniaturized semiconductor device having an increased number of pins and of maintaining its inherent shape in the following processes. Particularly, having the inner leads 21 having the tips each having one wide, highly flat and smooth surface formed by the first etching process, the lead frame 20 of the present invention has high aptitude for wire bonding.

Second Embodiment

A lead frame producing method in a second embodiment according to the present invention will be described hereinafter with reference to FIGS. 5 and 6, in which parts like or corresponding to those of the first embodiment previously described with reference to FIGS. 1 to 4B are designated by the same reference characters and the description thereof will be omitted.

Figure 5:
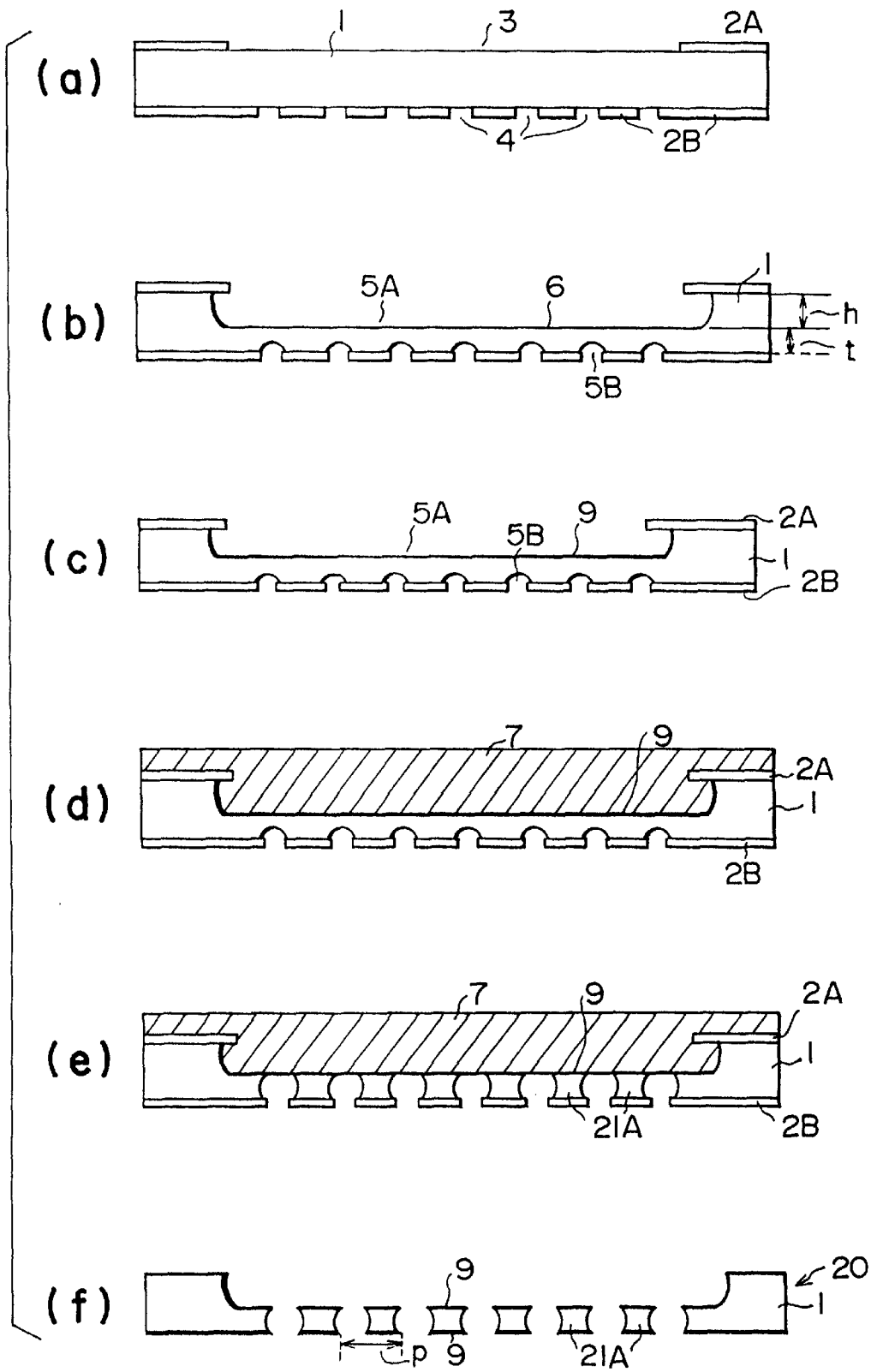
FIGS. 5A–5F are views assistance in explaining a method of forming a lead frame, in a second embodiment according to the present invention.

FIG. 5 shows an essential portion of a lead frame corresponding to a portion represented by the sectional view taken on line $A_1$–$A_2$ in FIG. 2A in different phases of a process for fabricating the lead frame in sectional views.

Referring to FIG. 5(a), a first major surface and a second major surface of a 0.15 mm thick copper blank 1 for forming a lead frame are coated with photoresist films of a water-soluble casein resist containing potassium dichromate as sensitive agent, respectively. The photoresist films are exposed through a first pattern mask 11 and a second pattern mask 12 (FIGS. 2C and 2D) and then developed to form a first resist pattern 2A having a first opening 3 of a predetermined shape and a second resist pattern 2B having second openings 4 of predetermined shapes over the first and the second major surface of the blank 1, respectively.

The first opening 3 of the first resist pattern 2A has the shape for entirely etching a wide area in the first major surface of the blank 1 and the second openings 4 of the second resist pattern 2B have the shapes corresponding to the those of the tips 21A of the inner leads 21 of a lead frame 20.

The first opening 3 of the first resist pattern 2A includes at least areas on the blank 1 corresponding to the tips 21A of the inner leads 21. However, the area to be etched by a first etching process must be greater than the area including the tips 21A of the inner leads 21, because the step between a thin portion of the blank 1 corresponding to the first opening 3 of the first resist pattern 2A and the rest portions of the blank 1 makes work for firmly cramping the lead frame 20 to hold the blank 1 difficult in, for example, a taping process and a bonding process.

Then, the first etching process is carried out to form recesses 5A and 5B in the blank 1 by etching both the major surfaces of the blank 1 covered with the first resist pattern 2A and the second resist pattern 2B, respectively, by spraying a 40 Bé ferric chloride aqueous solution of 57° C., i.e., a first etchant, at a pressure of 2.5 kg/cm through the first resist pattern 2A and the second resist pattern 2B against both the major surfaces of the blank 1, respectively. The first etching process is terminated after the depth h of the flat recess 5A corresponding to the first resist pattern 2A has reached a value in the range of ½ to ⅘ of the thickness of the blank 1 as shown in FIG. 5(b).

Then, as shown in FIG. 5(c), the exposed surface of the blank 1, provided with the recess 5A formed by the first etching process is cleaned, the cleaned exposed surface is subjected to a pickling process to remove oxides and hydroxides formed thereon, a protective film 9 for preventing oxidation and hydration is formed over the exposed surface, and then the blank 1 is cleaned with water and dried.

The protective film 9 for preventing oxidation and hydration is a film of several angstroms formed by spreading a 10% wt. benzotriazole solution e.g. (CB BRIGHT, MEC Co.) over the exposed surface of the blank 1.

In some cases, oxides and/or hydroxides are formed on the exposed surface of the blank 1 before an etch-resistant layer forming process for forming an etch-resistant layer 7 over the exposed surface of the blank 1 if the exposed surface is not covered with the protective film 9. The oxides and/or the hydroxides formed on the exposed surface is difficult to remove completely by a chemical polishing process which is carried out before a plating process, and the oxides and/or the hydroxides remaining on the exposed surface of the blank 1 cause irregular plating entailing faulty wire bonding. The protective film 9 prevents the formation of oxides and hydroxides on the exposed surface of the blank 1.

When forming the protective film 9, the exposed surface of the blank 1 formed by the first etching process is cleaned with water, the exposed surface is pickled for 30 sec with 10% wt. hydrochloric acid solution, the blank 1 is immersed in a 10% benzotriazole aqueous solution (CB BRIGHT, MEC Co.), and then the blank 1 is washed with water and dried. An organic or inorganic acid capable of dissolving oxides and hydroxides, such as acetic acid, may be used for pickling as well as hydrochloric acid. A suitable concentration of the pickling solution is in the range of 0.5 to 20% wt. and a suitable duration of pickling is in the range of 5 to 120 sec for removing of the protective film by a chemical polishing process which is carried out before a plating process. The pickling solution may contain an acid pickling inhibitor.

Then, the surface of the blank 1 provided with the recess 5A formed by the first etching process is coated with an etch-resistant hot-melt wax (acidic wax type MR-WB6, The Inktec Co.) by a die coater to form an etch-resistant layer 7 so as to fill up the recess 5A and to cover the first resist pattern 2A as shown in FIG. 5(d).

The thickness of a portion of the etch-resistant layer 7 covering the first resist pattern 2A is about 100 μm. Although the hot-melt wax employed in this embodiment is an alkali-soluble wax, any suitable wax resistant to the etching action of the etchant and remaining somewhat soft during etching may be used. A wax for forming the etch-resistant layer 7 is not limited to the aforesaid wax, but may be a wax of a UV-setting type.

Since the recess 5A is thus filled up with the etch-resistant layer 7, the flat bottom surface 6 of the recess 5A is not etched in the following second etching process. The etch-resistant layer 7 enhances the mechanical strength of the blank 1 for the second etching process to enable a second etchant to be sprayed at an increased spraying pressure, for example, 2.5 kg/cm or above, in the second etching process. The increased spraying pressure promotes the progress of etching in the direction of the thickness of the blank 1 in the second etching process, so that the perpendicularity of the side surfaces of etched recesses relative to the surface of the blank 1 can be improved. The etch-resistant layer 7 prevents the etching of portions other than the flat bottom surface 6 of the recess 5A, such as portions of the blank 1 corresponding to spaces between the adjacent outer leads.

Then, as shown in FIG. 5(e), the blank 1 is subjected to a second etching process, in which a second etchant, which is the same as the first etchant, is sprayed against the major surface provided with the recesses 5B of the blank 1 to form the tips 21A of inner leads 21 by etching through portions of the blank 1 corresponding to the recesses 5B.

Then, the etch-resistant layer 7, the first resist pattern 2A and the second resist pattern 2B are removed from the blank 1, the blank 1 is cleaned to obtain a semifinished lead frame 20 having inner leads 21 with the fine tips 21A. The etch-resistant layer 7, the first resist pattern 2A and the second resist pattern 2B can be dissolved and removed by a sodium hydroxide solution.

Then, the semifinished lead frame 20 is pickled to remove oxides and hydroxides by a pickling process similar to that carried out subsequent to the first etching process, the semifinished lead frame 20 is coated with a protective film 9 for preventing the formation of oxides and hydroxides, and then the semifinished lead frame 20 is washed with water and dried (FIG. 5(f)).

The fineness of the tips 21A of the inner leads 21 formed by this method is dependent on the depth h of the recess 5A; in other words, on the thickness t (FIG. 5(b)) of portions of the blank 1 corresponding to the tips 21A of the inner leads 21. For example, the pitch p between the tips 21A of the adjacent inner leads 21 can be 0.15 mm when the thickness t is 50 pm and the width $W_2$ (FIG. 3A) of the surfaces of the tips 21A of the inner leads 21 is 100 μm, and can be 0.12 mm when the thickness t is about 30 μm and the width $W_2$ is about 70 μm. The pitch p can be further reduced if the thickness t and the width $W_2$ are properly determined.

Figure 6:
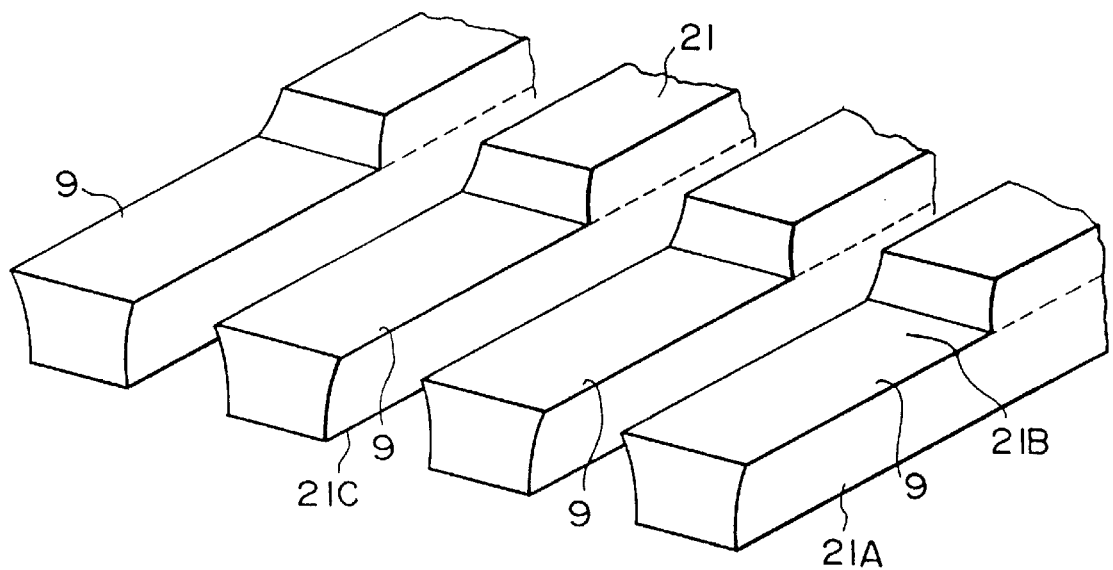
FIG. 6 is a fragmentary perspective view of inner leads of a lead frame embodying the present invention.

Referring to FIG. 6 showing the inner leads 21 of the lead frame 20 thus fabricated, the upper surfaces 21B, i.e., etched flat surfaces, of the tips 21A of the inner leads 21 are pickled to remove tarnishing substances on the upper surfaces 21B, such as oxides and hydroxides, before processes subsequent to the first etching process and the second etching process, and then the pickled upper surfaces 21B are coated with the protective film 9 to prevent oxidation and hydration. The lower surfaces 21C of the tips 21A of the inner leads 21 are pickled to remove tarnishing substances formed on the lower surfaces 21C, such as oxides and hydroxides, after the second etching process, and then the pickled lower surfaces 21C are coated with the protective film 9 to prevent oxidation and hydration. tarnishing substances, such as oxides and hydroxides, are forced scarcely on the surfaces 21B and 21C of the tips 21A of the inner leads 21.

Both the surfaces 21B and 21C of the tips 21A of the inner leads 21 are flat, and the tips 21A have a sectional shape as shown in FIG. 3A. Accordingly, both the surfaces 21B and 21C have good aptitude for wire bonding.

Both the surfaces 21B and 21C of the tips 21A of the inner leads 21 of the lead frame 20 are plated to facilitate wire bonding for electrically connecting the inner leads 21 to a semiconductor device. Experiments showed that both the surfaces 21B and 21C were uniformly plated and no faulty wire bonding occurred.

Since the lead frame fabricating method of the present invention reduces the thickness of only a portion of the blank 1 corresponding to the tips 21A of the inner leads 21 of the lead frame 20, the semifinished lead frame 20 has a sufficient mechanical strength to withstand external forces that may act on the semifinished lead frame 20 in the following processes. The lead frame fabricating method of the present invention is capable of fabricating the lead frame 20 of a copper alloy having the fine inner leads 21 arranged at a very small pitch and of fabricating the lead frame 20 having the inner leads 21 having the tips 21A having the surfaces 21B and 21C not tarnished by oxides and hydroxides that cause irregular plating of the surfaces 21B and 21C.

More specifically, the lead frame fabricating method of the present invention reduces the thickness of the portion of the blank 1 corresponding to the tips 21A of the inner leads 21 to a thickness suitable for forming the fine tips 21A by the first etching process, fills up the flat recess 5A formed by the first etching process with the etch-resistant layer 7, and processes the portion of the blank 1 having the reduced thickness to form the fine tips 21A. Furthermore, since the lead frame fabricating method of the present invention forms only the tips 21A of the inner leads 21 in a thickness smaller than that of the blank 1, while the conventional lead frame fabricating method uses a blank of a reduced thickness, the lead frame 20 fabricated by the lead frame fabricating method, as compared with a lead frame fabricated by the conventional lead frame fabricating method, is strong.

The etch-resistant layer 7 filling up the recess SA formed by the first etching process enhances the mechanical stability of the portion of the reduced thickness for forming the tips 21A of the blank 1 during the second etching process and secures a sufficient strength to withstand the etchant spraying pressure. Accordingly, the blank 1 can be accurately processed to form the lead frame 20 in a high accuracy.

Since the recess 5A is filled up with the etch-resistant layer 7, the flat bottom surface 6 of the recess 5A formed by the first etching process is not exposed directly to the etchant even when the portion of the blank 1 corresponding to spaces between the adjacent tips 21A of the inner leads 21 are etched through and thereby the flat surface 6 formed by the first etching process can be maintained to form the surfaces 21B and 21C of the tips 21A in a satisfactory flatness. The width $W_1$ of the upper surfaces 21B of the tips 21A of the inner leads 21 can be adjusted by adjusting the process conditions of the second etching process so that the width $W_1$ of the upper surfaces 21B of the tips 21A is greater than the width $W_2$ of the lower surfaces 21C of the same as shown in FIG. 3A. Therefore, both the upper surface 21B and the lower surface 21C of the tip 21A of each inner lead 21 are suitable for use in connecting the inner lead 21 to a semiconductor device by wire bonding.

After the first etching process, the exposed surface of the blank 1 of the copper alloy provided with the recess 5A is cleaned, is pickled to remove oxides and hydroxides and is coated with the protective film 9 for preventing oxidation and hydration. Then, the second etching process is carried out, the first resist pattern 2A and the second resist pattern 2B are removed, the blank 1 is cleaned, the exposed surface of the blank 1 is pickled entirely to remove oxides and hydroxides, and the pickled exposed surface is coated with the protective film 9 to prevent oxidation and hydration. Accordingly, both the surfaces 21B and 21C of the tips 21A of the inner leads 21 are not tarnished with oxides or hydroxides, so that both the surfaces 21B and 21C can be uniformly gold-plated or silver-plated for wire bonding.

In some cases, oxides and/or hydroxides are formed on the exposed surface of the blank 1 formed by the first etching process before an etch-resistant layer forming process for forming the etch-resistant layer 7 over the exposed surface of the blank 1 if the exposed surface is not covered with the protective film 9. The oxides and/or the hydroxides formed on the exposed surface is difficult to remove completely by a chemical polishing process which is carried out before a plating process, and the oxides and/or the hydroxides remaining on the exposed surface of the blank 1 cause irregular plating entailing faulty wire bonding. The lead frame fabricating method of the present invention cleans and pickles the exposed surface of the blank 1 and coats the exposed surface with the protective film 9 for preventing oxidation and hydration to prevent the formation of oxides and hydroxides on the exposed surface of the blank 1.

The surfaces 21B and 21C of the tips 21A of the inner leads 21 of the lead frame 20 of the copper alloy of the present invention are flat and are not tarnished by oxidation or hydration. Therefore, either the surfaces 21B or 21C of the tips 21A can be used for wire bonding.

The protective film 9 can be formed by a comparatively simple process, in which the exposed surface is immersed in a benzotriazole aqueous solution of a benzotriazole concentration in the range of 5 to 20% wt. or the benzotriazole aqueous solution is sprayed over the exposed surface.

Thus, the lead frame fabricating method of the present invention is capable of fabricating a lead frame of a copper alloy for use in constructing a resin-sealed semiconductor package, capable of coping with the miniaturization of semiconductor devices and the increase of the pins of semiconductor packages due to the increase of the electrode pads of the component semiconductor devices.

The lead frame fabricating method of the present invention is capable of fabricating a lead frame of a copper alloy, capable of coping with the miniaturization of semiconductor devices and the increase of electrode pads, having a sufficient strength to withstand external forces that may act thereon in an assembling process and a packaging process for assembling and packaging a semiconductor package having a large number of pins arranged at a very small pitch, and having the least unavoidable portions tarnished by oxides and hydroxides by etching processes.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A method for producing a lead frame having a plurality of outer leads and a plurality of inner leads respectively having tips, for a resin-sealed semiconductor package, comprising the steps of:

coating a first and a second major surface of a blank for a lead frame with a first and a second photoresist layer, respectively;

thereafter, forming a first resist pattern having a first opening on the first major surface of the blank by exposing the first photoresist layer through a first pattern mask and a second resist pattern having second openings on the second major surface of the blank by exposing the second photoresist layer through a second pattern mask;

then, applying a first etchant to the first and second major surfaces of the blank to form a first etched recess in the first major surface, and to form a second etched recess in the second major surface without penetrating the blank to the first etched recess;

thereafter, forming an etch-resistant layer of an etchresistant material to fill the first etched recess in the first major surface of the blank;

then, applying a second etchant to the second major surface of the blank to etch through remaining portions of the blank from the second etched recess; and thereafter, removing the etch-resistant layer, the first resist pattern and the second resist pattern from the resulting lead frame and cleaning the lead frame.

2. The method for producing a lead frame according to claim 1, wherein the first opening of the first resist pattern exposes an area on the first major surface of the blank in which the tips of the inner leads of the lead frame are to be formed, and the second openings of the second resist pattern expose areas on the second major surface of the blank to form the tips of the inner leads of the lead frame.

3. The method for producing a lead frame according to claim 1, wherein the blank comprises a 42% Ni/Fe alloy, and the first etchant comprises a ferric chloride aqueous solution at a temperature of at least 55° C. and of a ferric chloride concentration of at least 47 Bé.

4. The method for producing a lead frame, according to claim 1, wherein
   the depth of the etched recess formed in the first major surface of the blank is ½ to ⅘ of the thickness of the blank.

* * * * *